(12) United States Patent
Nagata

(10) Patent No.: US 7,550,771 B2
(45) Date of Patent: Jun. 23, 2009

(54) THIN FILM TRANSISTOR, MANUFACTURING METHOD THEREOF, AND ACTIVE MATRIX DISPLAY APPARATUS

(75) Inventor: Hitoshi Nagata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 109 days.

(21) Appl. No.: 11/697,073

(22) Filed: Apr. 5, 2007

(65) Prior Publication Data

US 2007/0235777 A1 Oct. 11, 2007

(30) Foreign Application Priority Data

Apr. 6, 2006 (JP) ............... 2006-104886

(51) Int. Cl.
*H01L 27/32* (2006.01)
(52) U.S. Cl. ............ 257/72; 257/347; 257/350; 257/E31.041; 257/E29.117; 257/E29.151
(58) Field of Classification Search ............ 257/347, 257/350, 72, E31.041, E29.117, E29.151
See application file for complete search history.

(56) References Cited

U.S. PATENT DOCUMENTS

| 6,300,241 | B1 * | 10/2001 | Moore et al. ............ 438/637 |
| 6,956,324 | B2 | 10/2005 | Yamazaki |
| 2001/0028217 | A1 * | 10/2001 | Kataoka et al. ............ 313/506 |
| 2002/0048870 | A1 * | 4/2002 | Lane ............ 438/186 |
| 2003/0132470 | A1 * | 7/2003 | Joshi et al. ............ 257/295 |
| 2005/0247937 | A1 * | 11/2005 | Yamazaki et al. ............ 257/59 |
| 2006/0014465 | A1 | 1/2006 | Yamazaki |
| 2007/0247556 | A1 * | 10/2007 | Jang et al. ............ 349/38 |

FOREIGN PATENT DOCUMENTS

| JP | 10-161095 | 6/1998 |
| JP | 2002-93576 | 3/2002 |
| JP | 2002-93586 | 3/2002 |
| JP | 2002-117971 | 4/2002 |

OTHER PUBLICATIONS

Yih-Rong Luo, et al. "The Electrical Characteristics of Low Temperature Polycrystalline Silicon Thin Film Transistors Fabricated on Steel Foil," Proceedings of AM-LCD'05 (2005), pp. 231-234.
Nigel Young, et al. "LTPS on Passivated Stainless Steel Substrates for AMOLEDs and Others Applications" Proceedings of AM-LCD'05 (2005), pp. 239-240.

(Continued)

*Primary Examiner*—Ngan Ngo
*Assistant Examiner*—Benjamin Tzu-Hung Liu
(74) *Attorney, Agent, or Firm*—Oblon, Spivak, McClelland, Maier & Neustadt, P.C.

(57) ABSTRACT

A thin film transistor includes a metal substrate, a first conductive barrier layer placed on the metal substrate to prevent diffusion of substance of the metal substrate, a protective insulating film placed on the first conductive barrier layer, a semiconductor layer placed on the protective insulating film and including a source region, a drain region and a channel region, a gate insulating film placed on the semiconductor layer, and a gate electrode placed above the semiconductor layer with the gate insulating film interposed therebetween. The first conductive barrier layer and the semiconductor layer are electrically connected through a first opening of the protective insulating film.

24 Claims, 8 Drawing Sheets

OTHER PUBLICATIONS

"Study of the Overall CU Metallization with a Substitutional Nitride Alloy in Si-ULSI," NEDO 2002 Research Grant Project (two joint projects) Report, Information and Communications Technology, B-2 (Project ID:00A22021a), 7 pages, (with English Abstract and English translation of related portion.).

Mayumi Takeyama, et al. "Solid-Phase Reactions of Diffusion Barriers of Ti and TiN to Copper Layers on $SIO_2$," Jpn. J. Appl. Phys. vol. 35 (Jul. 1996) pp. 4027-4033.

Kizil Huseyin, et al. "TiN and TaN diffusion barriers in copper interconnect technology: Towards a consistent testing methodology," Journal of Electronic Materials, 6 pages, Apr. 2001.

* cited by examiner

THIN FILM TRANSISTOR, MANUFACTURING METHOD THEREOF, AND ACTIVE MATRIX DISPLAY APPARATUS

BACKGROUND OF THE INVENTION

1. Field of the Invention

The present invention relates to a thin film transistor, a manufacturing method of the same, and an active matrix display apparatus. Particularly, the present invention relates to a thin film transistor formed on a metal substrate, a manufacturing method of the same, and an active matrix display apparatus including the thin film transistor.

2. Description of the Related Art

With the recent intensive development of highly sophisticated visualization and information society and rapid proliferation of multimedia systems, display apparatus such as LCDs (Liquid Crystal Displays) and organic EL (Electro Luminescence) displays become increasingly important. Such display apparatus have advantages such as low power consumption, low profile and lightweight and are thus widely used as a display of a portable terminal device or the like in place of CRT (Cathode Ray Tube) which have been dominant before.

As a driving method of pixels in such liquid crystal display apparatus and organic EL display apparatus, active matrix using TFTs (Thin Film Transistors) arranged in an array on a substrate is widely adopted. A TFT used in the active matrix display apparatus such as liquid crystal display apparatus typically has the structure that a source region, a drain region and a channel region are formed in a silicon layer that is deposited on a glass substrate. The display apparatus using a TFT array substrate does not have the flexibility in shape and thus it is not suited for a curved surface.

In order to increase the flexibility in shape of display apparatus, a technique of forming a TFT on a plastic substrate or a metal substrate has been proposed. However, because a plastic substrate has low heat-resistance, it is difficult to process a silicon layer to be formed on the plastic substrate to thereby complicate the manufacturing process. Therefore, the use of a metal substrate attracts attention in order to produce a shape-flexible display apparatus with a relatively simple manufacturing method. A flexible display apparatus using such a metal substrate is disclosed in Y. R. Luo et al., "The Electrical Characteristics of Low Temperature Polycrystalline Silicon Thin Film Transistor Fabricated on Steel Foil", Proceedings of AM-LCD'05, (2005), p.231, and N. Young et al., "LTPS on Passivated Stainless Steel Substrates for AMOLEDs and Other Applications", Proceedings of AM-LCD'05, (2005), p.239. Particularly, an organic EL display device is well suited for the use of a flexible metal substrate because it employs a solid-state light-emitting device.

As disclosed therein, each TFT formed on the metal substrate has substantially the same structure as a TFT formed on a glass substrate in related arts. The TFT is formed on an insulating protective film deposited on the metal substrate. The insulating protective film may be an inorganic or organic insulating film.

In a plurality of TFTs on the metal substrate of related arts, the voltage of a silicon layer to form each TFT is not fixed. Thus, the electrical characteristics of each TFT which is formed on the metal substrate are unstable. For example, an electron-positive hole pair occurs due to electron collision to thereby accumulate a charge in the silicon layer. As a result, a threshold voltage varies by the effect of back-gate bias. The use of a TFT with such unstable characteristics leads to degradation of display characteristics. The degradation of TFT characteristics is significant when using a low-temperature polysilicon TFT. Further, because the organic EL display apparatus employs current drive system, it requires severe characteristics for a TFT.

It is possible to fix a common voltage of TFTs to the voltage of a metal substrate by using the metal substrate as a common voltage line. However, direct connection of the metal substrate and a silicon layer of a TFT promotes alloying and interdiffusion at the interface between the metal substrate and the silicon layer. This causes the contamination of a channel region by substance of the metal substrate to degrade the TFT characteristics, which leads to a decrease in the reliability of an active matrix display apparatus.

In an active matrix display apparatus, circuits including TFTs are formed on an insulating film that is deposited on the metal substrate. A line for providing a common voltage of TFTs is thus required. With an increase in load due to an increase in the number of pixels, the reduction of resistance of the common voltage line becomes more important. For example, a self-luminous active matrix luminous display apparatus such as an organic EL display apparatus includes a pixel electrode for transmitting a picture signal formed on the circuits, a counter electrode placed face to face with the pixel electrode with a luminous layer interposed therebetween, and so on. A line is also required for voltage fixation and current supply to the counter electrode, and the reduction of resistance of the line is important. Although it is possible to fix a voltage by bringing the counter electrode of the active matrix luminous display apparatus into connect with the metal substrate, a transparent electrode used for the counter electrode is hard to make an electrical connection with the metal substrate. Further, the problem of alloying and interdiffusion exists also at the interface between the metal substrate and the line to provide a common voltage. This causes a decrease in the quality of display apparatus.

SUMMARY OF THE INVENTION

In view of the foregoing, it is an object of the present invention to provide a thin film transistor with stable characteristics, a manufacturing method of the same, and an active matrix display apparatus including the thin film transistor.

According to one aspect of the present invention, there is provided a thin film transistor including a metal substrate; a first conductive barrier layer placed on the metal substrate to prevent diffusion of substance of the metal substrate; a protective insulating film placed on the first conductive barrier layer and having an opening; a semiconductor layer placed on the protective insulating film, including a source region, a drain region and a channel region, and electrically connected with the first conductive barrier layer through the opening; a gate insulating film placed on the semiconductor layer; and a gate electrode placed above the semiconductor layer with the gate insulating film interposed therebetween.

The present invention provides a thin film transistor with stable characteristics, a manufacturing method of the same, and an active matrix display apparatus including the thin film transistor.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE PREFERRED EMBODIMENTS

Exemplary embodiments of the present invention are described hereinafter. The following description is given by way of illustration only and is not to be construed to limit the present invention.

First Embodiment

Figure 1:
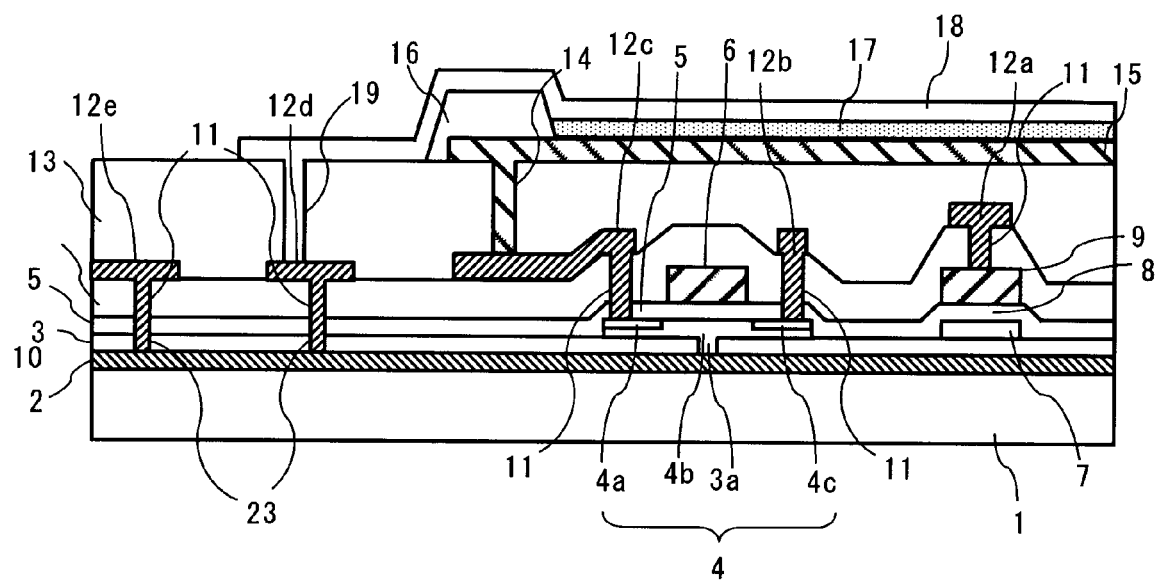
FIG. 1 is a cross-sectional view showing the structure of an active matrix organic EL display apparatus according to a first embodiment of the invention.

An active matrix display apparatus using a thin film transistor according to a first embodiment of the present invention is described hereinafter with reference to FIG. 1. FIG. 1 is a cross-sectional view showing the structure of an active matrix display apparatus according to this embodiment. An organic EL display apparatus including a coplanar TFT is described hereinbelow as an example of the active matrix display apparatus. A driving TFT used in an organic EL display apparatus and the peripheral structure are described below. A TFT according to this embodiment is not limited to the use as a driving TFT of an organic EL display apparatus.

The organic EL display apparatus according to this embodiment includes a metal substrate 1, a first conductive barrier layer 2, a protective insulating film 3, a semiconductor layer 4, a gate insulating film 5, a gate electrode 6, a first capacitor electrode 7, a capacitor insulating film 8, a second capacitor electrode 9, a first interlayer insulating film 10, a contact hole 11, a wiring 12, a second interlayer insulating film 13, a contact hole 14, a pixel electrode 15, an opening insulating film 16, a luminous layer 17, a counter electrode 18, and a contact hole 19. The wiring 12 involves a line 12a, a line 12b, a line 12c, a line 12d, and a line 12e. As shown in FIG. 1, one pixel of the organic EL display apparatus includes a TFT and a capacitor. In FIG. 1, the upper side is a viewing side (front side), and the lower side is a non-viewing side (rear side).

For the metal substrate 1, a material may be selected among several alternatives. One of advances of the metal substrate 1 is the flexibility in shape. When placing importance on the flexibility, processing stability, low costs or the like, a metal substrate of Al or an Al alloy may be selected. Further, to take the stability against deterioration such as distortion due to heat treatment during the manufacturing process into consideration, it is preferred to use a metal substrate having a linear expansion coefficient that is closed to the linear expansion coefficient ($\sim 5*10^{-6}/^\circ$ C.) of the semiconductor layer 4 formed above the metal substrate 1. It is, however, preferred that a compressive stress rather than a tensile stress is applied to the semiconductor layer 4 at room temperature. In consideration of these points, a low-expansion alloy such as kovar and inver, low-expansion stainless-steel or the like may be selected. Furthermore, to reduce the weight of the entire organic EL display apparatus, the weight of the metal substrate 1 is preferably low. In this view, an Al alloy, a Ti alloy or the like may be selected. The use of a stainless-steel substrate or the like is also possible.

The surface of the metal substrate 1 is preferably treated to be flat and smooth by electrical field abrasive polishing or the like. Generally, the flatness of the metal substrate 1 is preferably 50 μm or below. The smoothness of the metal substrate 1 is preferably 20 nm or below at an RMS (Root Mean Square) value indicating the surface roughness.

The first conductive barrier layer 2 is formed on the metal substrate 1. The first conductive barrier layer 2 suppresses the diffusion of substance of the metal substrate 1 in order to avoid the contamination of the semiconductor layer 4 to be formed thereabove by the diffused substance of the metal substrate 1. This prevents the contamination of the channel region of the semiconductor layer 4 to thereby avoid the degradation of TFT characteristics.

A material of the first conductive barrier layer 2 is described in detail in Takeyama et al., "Study of the Overall Cu Metallization with a Substitutional Nitride Alloy in Si-ULSI", NEDO 2002 Research Grant Project (two joint projects) Report, Information and Communications Technology, B-2 (Project ID: 00A22021a).

In view of the report, a high melting point metal or a conductive high melting point metal nitride such as Ti, Ta, W, Mo, TiN, TaN, WN, MoN, ZrN, VN, HfN, NbN, TiZrN, ZrVN or the like may be selected as a material of the first conductive barrier layer 2.

However, the first conductive barrier layer 2 needs to suppress the diffusion of metal substance to the semiconductor layer 4 by the alloying with the semiconductor layer 4 in addition to suppress the diffusion of metal substance by the alloying with the metal substrate 1. In consideration of a low diffusion speed by the alloying with the metal substrate 1 and the diffusion by alloying with the semiconductor layer 4 it is preferred to select TiN, TaN, ZrN and VN as described in M. Takeyama et al., "Solid-Phase Reactions of Diffusion Barriers of Ti and TiN to Copper Layers on SiO2", Jpn. J. Appl.

Phys., Vol. 35 (1996), p.4027-4033, and K. Huseyin et al., "TiN and TaN diffusion barriers in copper interconnect technology: Towards a consistent testing methodology", Journal of Electronic Materials, April 2001.

Accordingly, it is preferred as the first conductive barrier layer 2 to use a single-layer film of TiN, TaN, ZrN or VN or a composite film having TiN, TaN, ZrN or VN as an upper layer.

The protective insulating film 3 is formed on the first conductive barrier layer 2. The protective insulating film 3 suppresses the diffusion of the first conductive barrier layer 2 or the metal substance of the metal substrate 1 to the upper part. As the protective insulating film 3, it is necessary to use a material that does not create a trap level of an electron or positive hole at the interface with the semiconductor layer 4 formed thereabove or, particularly, with a channel region 4*b* described later. Although a silicon nitride film is effective for suppressing the metal diffusion, it is likely to create a trap level. On the other hand, although a silicon oxide film is not likely to create a trap level, it is not effective for suppressing the metal diffusion. Thus, the protective insulating film 3 is preferably a composite film that has a silicon nitride film or a silicon oxide/nitride film as a lower layer and a silicon oxide film as an upper layer.

The parasitic capacitance that occurs between the metal substrate 1 and the gate electrode 6, a source region 4*c* and a drain region 4*a* that are formed on the protective insulating film 3 can cause deterioration of TFT characteristics and a circuit including a TFT. It is therefore necessary to reduce the parasitic capacitance. For this reason, the thickness of the protective insulating film 3 is preferably 1 μm or above on the basis of the permittivity of the silicon oxide film.

A TFT and a capacitor are formed on the protective insulating film 3. The structure of a TFT portion is described hereinafter. A first opening 3*a* is made in a part of the protective insulating film 3. Above the first opening 3*a*, the semiconductor layer 4 to form a TFT is deposited. An amorphous silicon film, a micro-crystal silicon film, a polycrystalline silicon film or the like may be used as the semiconductor layer 4. Alternatively, the semiconductor layer 4 may be made of a material other than silicon. The semiconductor layer 4 is formed to fill the first opening 3*a*. The semiconductor layer 4 is thus electrically connected with the first conductive barrier layer 2 through the first opening 3*a*. The semiconductor layer 4 has the drain region 4*a*, the channel region 4*b* and the source region 4*c*. A part of the channel region 4*b* is electrically connected with the first conductive barrier layer 2 through the first opening 3*a* in the protective insulating film 3. The first opening 3*a* has the size that does not cause current leakage between the drain region 4*a* and the source region 4*c* of the TFT.

The gate insulating film 5 is formed on the semiconductor layer 4. The gate insulating film 5 should not create a trap level of an electron or positive hole at the interface with the semiconductor layer 4. It is thus preferred to use a thermal oxide film of the semiconductor layer 4. If it is necessary to lower the heat treatment temperature, a silicon oxide film formed by CVD may be used. A CVD film that is less likely to create a trap level may be formed by using a TEOS material or performing a wet heat treatment after the film deposition.

The gate electrode 6 is formed on the gate insulating film 5. As the gate electrode 6, a metal or polycrystalline silicon doped with impurity may be used. Aligning the source region 4*c*, the drain region 4*a* and the channel region 4*b* that are included in the semiconductor layer 4 with the gate electrode 6 can reduce the parasitic capacitance of a TFT. A TFT includes the semiconductor layer 4, the gate insulating film 5, and the gate electrode 6.

The structure of a capacitor portion is described hereinafter. The first capacitor electrode 7 is formed on the protective insulating film 3 outside the field of the first opening 3*a*. The first capacitor electrode 7 may be made of the same material as the semiconductor layer 4 and formed at the same time with the semiconductor layer 4. For example, if the semiconductor layer 4 is formed of a polysilicon film, the first capacitor electrode 7 may be also formed of the polysilicon film. A channel conductive layer may be formed in the first capacitor electrode 7 by applying a voltage from the second capacitor electrode 9 described later, or the conductivity may be added to the first capacitor electrode 7 by doping.

The capacitor insulating film 8 is formed on the first capacitor electrode 7. The capacitor insulating film 8 is formed at the same time as the gate insulating film 5 using the same material. The second capacitor electrode 9 is formed on the capacitor insulating film 8. The second capacitor electrode 9 is formed at the same time as the gate electrode 6 using the same material. The capacitor includes the first capacitor electrode 7, the capacitor insulating film 8, and the second capacitor electrode 9. The capacitor insulating film 8 may have a different property and thickness from the gate insulating film 5 to thereby control the capacitance.

The first interlayer insulating film 10 is formed to cover the TFT and the capacitor. The first interlayer insulating film 10 mainly functions to have electrical insulation with the wiring 12 formed thereon, to reduce the parasitic capacitance between the wiring 12 and the gate electrode 6, to suppress the diffusion of hydrogen component such as hydrogen and water contained in the film under the first interlayer insulating film 10, and so on. It is thus preferred to use a silicon oxide film, a silicon nitride film, a laminated film of a silicon oxide film and a silicon nitride film or the like as the first interlayer insulating film 10. The thickness of the first interlayer insulating film 10 is preferably 300 nm or above if it is a silicon oxide film, and 600 nm or above if it is a silicon nitride film.

The contact hole 11 is created in the first interlayer insulating film 10. The wiring 12 is formed above the contact hole 11. As described earlier, the wiring 12 involves the line 12*a*, the line 12*b*, the line 12*c*, the line 12*d* and the line 12*e*. The line 12*a* is connected with the second capacitor electrode 9. The line 12*b* and the line 12*c* are connected with the source region 4*c* and the drain region 4*a* of the semiconductor layer 4, respectively. The line 12*c* is further connected with the pixel electrode 15, which is described later. The line 12*c* thus makes a connection between the drain region 4*a* of the semiconductor layer 4 and the pixel electrode 15.

The line 12*d* and the line 12*e* are electrically connected with the first conductive barrier layer 2 through the contact hole 11 of the first interlayer insulating film 10 and a contact hole 23 of the protective insulating film 3. The line 12*d* is further connected with the counter electrode 18, which is described later. The line 12*d* thus makes a connection between the first conductive barrier layer 2 and the counter electrode 18.

As described above, the line 12*c* connected with the drain region 4*a*, the line 12*b* connected with the source region 4*c*, the line 12*a* connected with the second capacitor electrode 9, the line 12*e* connected with the first conductive barrier layer 2, and the line 12*d* connected with the first conductive barrier layer 2 and the counter electrode 18 which is described later are provided.

For example, the line 12*b* connected with the source region 4*c* receives a picture signal from an external driver. The line 12*c* connected with the drain region 4*a* supplies a drive current to the pixel electrode 15, which is described later. The line 12*d* connected with the counter electrode 18 supplies the drive current from the pixel electrode 15 to the metal substrate 1. The line 12a connected with the second capacitor electrode 9 is connected with a switching TFT (not shown) or the like.

The first conductive barrier layer 2 is formed over substantially the entire surface of the metal substrate 1. It is thus possible to supply a stable common voltage if the metal substrate 1 has a common voltage. Specifically, the first conductive barrier layer 2 formed substantially all over the metal substrate 1 has a common voltage. With the use of the first conductive barrier layer 2, it is possible to supply a common voltage to the line 12d of each pixel without complicated wiring. It is thereby possible to supply a common voltage to the counter electrode 18 with simple structure. In addition to the counter electrode 18, a common voltage may be supplied to another transistor (not shown), another capacitor (not shown), or the like through the first conductive barrier layer 2. This allows a common voltage to be easily supplied to a circuit device such as a switching TFT formed in a pixel.

The second interlayer insulating film 13 is formed on the wiring 12. Above the second interlayer insulating film 13, the pixel electrode 15 and the counter electrode 18 are formed opposite to each other with the luminous layer 17 interposed therebetween. The luminous layer 17 emits light by supplying a drive current between the pixel electrode 15 and the counter electrode 18 so that a current flows to the luminous layer 17. The emitted light is output to the viewing side through the counter electrode 18.

If there is a film thickness degraded portion in the luminous layer 17 between the pixel electrode 15 and the counter electrode 18, it causes electrical leakage to occur. The thickness of the luminous layer 17 is about 100 nm, and film degradation is likely to occur by the uneven surface of the pixel electrode 15. It is thus preferred that the surface of the second interlayer insulating film 13 is smooth with the surface roughness of 50 nm or less at an RMS value in the 100 $\mu m^2$ area. One of the methods to smooth the surface of the second interlayer insulating film 13 is spin coating of a SOG (Spin On Glass) film. A siloxane material may be used for the SOG film.

It is also possible to form the second interlayer insulating film 13 using a CVD insulating film and smooth the film by CMP (Chemical Mechanical Polishing). This provides not only smoothness but also flatness to the second interlayer insulating film 13. It is further possible to form a CVD insulating film on the SOG film described above and treat the CVD insulating film by the CMP process. This enables the formation of the second interlayer insulating film 13 with more flat and smooth surface.

The second interlayer insulating film 13 has the characteristics that it releases water after the film deposition, which causes contamination and degradation of the luminous layer 17. Thus, the second interlayer insulating film 13 should be a film having a smooth surface with less water release. Therefore, the second interlayer insulating film 13 is preferably a silicon oxide film, a silicon nitride film, or a laminated film of these films. The use of the silicon nitride film as an upper layer allows further suppression of water release from a lower layer.

The pixel electrode 15 is formed on the second interlayer insulating film 13. The pixel electrode 15 is connected with the line 12c through the contact hole 14 in the second interlayer insulating film 13. The pixel electrode 15 is thereby electrically connected with the drain region 4a. The pixel electrode 15 is preferably made of highly reflective film such as Ag or Al. This allows the light emitted from the luminous layer 17 on the pixel electrode 15 toward the non-viewing side (to the pixel electrode 15) to be reflected toward the viewing side to thereby increase the luminous efficiency. Further, it is necessary for the pixel electrode 15 to have high injection efficiency to inject carrier into the luminous layer 17, and a film with high injection efficiency is laminated according to the kind of carrier (positive hole or electron).

For the same reason as for the second interlayer insulating film 13 described above, the surface of the pixel electrode 15 should be smooth. The surface roughness of the pixel electrode 15 is preferably 50 nm or less at an RMS value in the 100 $\mu m^2$ area.

The opening insulating film 16 is formed on the pixel electrode 15. The opening insulating film 16 may be made of a polyimide resin or the like. The opening insulating film 16 has a plurality of rectangular openings to expose a part of the pixel electrode 15. The plurality of openings are arranged in matrix. Thus, the opening insulating film 16 has a lattice pattern. In this opening, the luminous layer 17 is formed between the pixel electrode 15 and the counter electrode 18 as described later. The pixel electrode 15, the luminous layer 17 and the counter electrode 18 that are sequentially laminated on the metal substrate 1 constitute an organic EL device. One organic EL device serves as one pixel. Accordingly, each opening serves as one pixel. Therefore, a display area is formed corresponding to the openings arranged in matrix.

In the opening of the opening insulating film 16, the luminous layer 17 is formed on the pixel electrode 15. The structure of the luminous layer 17 varies according to a material of an organic luminous layer used. For example, for a low-molecular organic EL material, a laminated film of a positive hole transporting layer, an organic luminous layer, an electron transporting layer, an electron injection layer and so on may be vapor-deposited. For a high-molecular organic EL material, an organic luminous layer may be formed by inkjet.

The counter electrode 18 is formed on the luminous layer 17. A transparent conductive material such as ITO (Indium Tin Oxide) may be used as the counter electrode 18. The light emitted from the luminous layer 17 is thereby output to the viewing side through the counter electrode 18. The counter electrode 18 is electrically connected with the line 12d through the contact hole 19 in the second interlayer insulating film 13. As described earlier, the line 12d is connected with the first conductive barrier layer 2 through the contact hole 11 in the first interlayer insulating film 10 and the contact hole 23 in the protective insulating film 3. Thus, the counter electrode 18 and the first conductive barrier layer 2 are connected through the line 12d, so that the counter electrode 18 is fixed to the voltage of the metal substrate 1. The counter electrode 18 can thus have a common voltage.

It has been difficult to establish an electrical connection between the counter electrode 18 made of a transparent conductive material and the metal substrate 1 according to related arts. Therefore, in order to fix the voltage of the counter electrode 18, it is necessary to insert a conductive layer such as Al between the metal substrate 1 and the counter electrode 18, which complicates the manufacturing process. On the other hand, this embodiment establishes an electrical connection between the first conductive barrier layer 2 formed on the metal substrate 1 and the counter electrode 18 through the contact holes 19 and 11. The voltage of the counter electrode 18 can be thus easily fixed to the voltage of the metal substrate 1. It is thereby possible to simplify the structure of the wiring 12 to enable simplification of the manufacturing process.

Further, the first conductive barrier layer 2 suppresses the diffusion of impurity from the metal substrate 1 to the semiconductor layer 4. It is thereby possible to provide an organic EL display apparatus having TFTs with stable characteristics. Furthermore, because the first conductive barrier layer 2 is placed between the substrate 1 and the protective insulating film 3, the voltage of the semiconductor layer 4 of TFT is fixed to the voltage of the metal substrate 1 through the first conductive barrier layer 2. It is thus possible to supply a common voltage through the semiconductor layer 4 that fills at least part of the first opening 3a. This stabilizes the voltage of the semiconductor layer 4 of TFT to thereby improve the TFT characteristics.

The first conductive barrier layer 2 and the line 12e are connected through the contact hole 11. A common voltage of the circuits including TFTs that are placed on the metal substrate 1 can be thus obtained easily from the metal substrate 1. Further, a current may be supplied from the rear side of the metal substrate 1. For example, the first conductive barrier layer 2 and the counter electrode 18 may be connected through the line 12d. It is thereby possible to easily fix the voltage of the counter electrode 18 to the voltage of the metal substrate 1 in the organic EL display apparatus. This enables the provision of an organic EL display apparatus that includes the counter electrode 18 with a stable voltage. Further, the above-described structure enables simplification of a circuit including a TFT on the metal substrate 1 to thereby lower the line resistance such as a capacitor. As described above, a common voltage is supplied using the first conductive barrier layer 2 formed substantially all over the metal substrate 1. It is thereby possible to supply a common voltage easily to each pixel. Specifically, a common voltage can be supplied easily by crating a contact hole to reach the first conductive barrier layer 2 in a pixel. With the use of the first conductive barrier layer 2, it is possible to suppress an increase in the manufacturing process.

Second Embodiment

Figure 2:
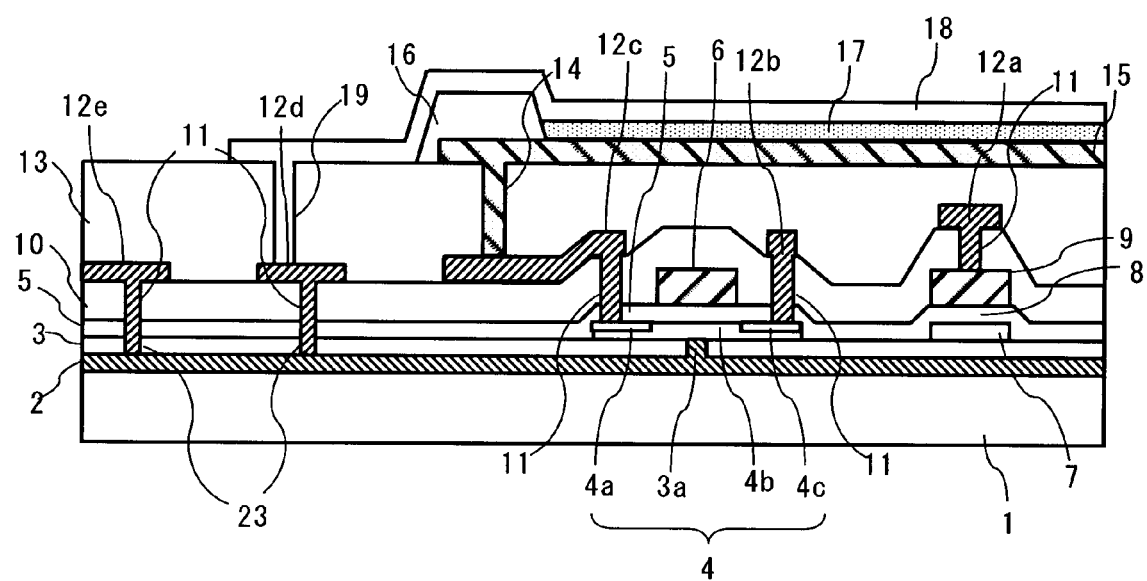
FIG. 2 is a cross-sectional view showing the structure of an active matrix organic EL display apparatus according to a second embodiment of the invention.

An active matrix display apparatus according to a second embodiment of the present invention is described hereinafter with reference to FIG. 2. FIG. 2 is a cross-sectional view showing the structure of an organic EL display apparatus according to this embodiment. This embodiment is different from the first embodiment in that the first opening 3a in the protective insulating film 3 is filled with the first conductive barrier layer 2. In FIG. 2, the same elements as in FIG. 1 are denoted by the same reference numerals and the redundant description is not provided herein.

The organic EL display apparatus according to this embodiment includes a metal substrate 1, a first conductive barrier layer 2, a protective insulating film 3, a semiconductor layer 4, a gate insulating film 5, a gate electrode 6, a first capacitor electrode 7, a capacitor insulating film 8, a second capacitor electrode 9, a first interlayer insulating film 10, a contact hole 11, a wiring 12, a second interlayer insulating film 13, a contact hole 14, a pixel electrode 15, an opening insulating film 16, a luminous layer 17, a counter electrode 18, and a contact hole 19. Although a silicon material fills the first opening 3a according to the first embodiment, a conductive barrier layer material fills the first opening 3a according to this embodiment. As described in the first embodiment, the wiring 12 involves a line 12a, a line 12b, a line 12c, a line 12d, and a line 12e.

As shown in FIG. 2, the first conductive barrier layer 2 is formed so as to lie under the protective insulating film 3 and to fill a part or whole of the first opening 3a in the protective insulating film 3. Thus, the semiconductor layer 4 to form a TFT is electrically connected with the first conductive barrier layer 2 in the first opening 3a. This structure also allows the voltage of the semiconductor layer 4 to be fixed to the voltage of the metal substrate 1. It is further possible to suppress the degradation of TFT characteristics due to the diffusion of substance of the metal substrate 1.

For example, after creating the first opening 3a in the protective insulating film 3, the first conductive barrier layer 2 having the thickness corresponding to the thickness of the protective insulating film 3 is further formed on the protective insulating film 3. After that, the rest of the first conductive barrier layer 2 outside of the first opening 3a is removed. The above-described structure is thereby produced.

Although the first opening 3a is filled with the first conductive barrier layer 2 in this embodiment, it is not limited thereto. The first opening 3a may be filled with a material different from the first conductive barrier layer 2 below the protective insulating film 3. In such a case, a conductive barrier material to fill the first opening 3a may be selected on condition that it is hardly diffused to the semiconductor layer 4, it has good electrical connectivity with the first conductive barrier layer, or the like. Another important condition is that it is easy to perform smoothing process such as CMP after filling the first opening 3a of the protective insulating film 3 with a selected conductive barrier material. In view of these conditions, it is preferred to use a single-layer film of TiN, TaN, ZrN or VN or a composite film having TiN, TaN, ZrN or VN as an upper layer.

Third Embodiment

Figure 3:
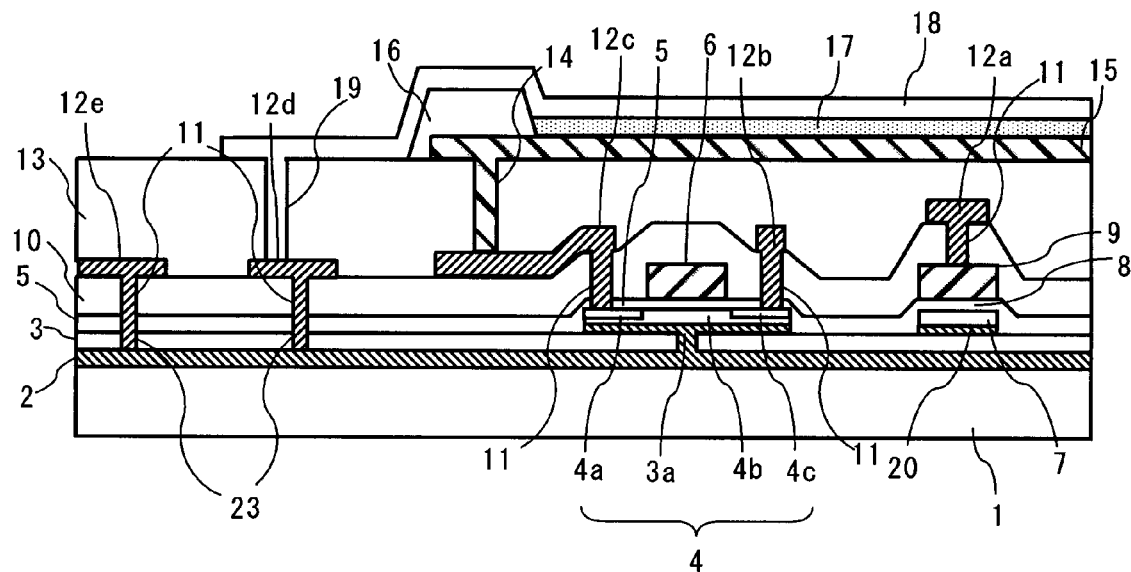
FIG. 3 is a cross-sectional view showing the structure of an active matrix organic EL display apparatus according to a third embodiment of the invention.

An active matrix display apparatus according to a third embodiment of the present invention is described hereinafter with reference to FIG. 3. FIG. 3 is a cross-sectional view showing the structure of an organic EL display apparatus according to this embodiment. This embodiment is different from the first and the second embodiments in that the first opening 3a in the protective insulating film 3 is partly or entirely filled with the first conductive barrier layer 2, and the first conductive barrier layer 2 extends over the protective insulating film 3. In FIG. 3, the same elements as in FIG. 1 are denoted by the same reference numerals and the redundant description is not provided herein.

The organic EL display apparatus according to this embodiment includes a metal substrate 1, a first conductive barrier layer 2, a protective insulating film 3, a semiconductor layer 4, a gate insulating film 5, a gate electrode 6, a first capacitor electrode 7, a capacitor insulating film 8, a second capacitor electrode 9, a first interlayer insulating film 10, a contact hole 11, a wiring 12, a second interlayer insulating film 13, a contact hole 14, a pixel electrode 15, an opening insulating film 16, a luminous layer 17, a counter electrode 18, a contact hole 19, and a second conductive barrier layer 20. As described in the first embodiment, the wiring 12 involves a line 12a, a line 12b, a line 12c, a line 12d, and a line 12e.

As shown in FIG. 3, the first conductive barrier layer 2 is formed so as to fill a part or whole of the first opening 3a in the protective insulating film 3 and to further extend over the protective insulating film 3. Further, the first conductive barrier layer 2 is formed partly or entirely below the semiconductor layer 4. If the first conductive barrier layer 2 covers all over the top surface of the protective insulating film 3, it causes a short-circuit between TFTs. To avoid this, the first conductive barrier layer 2 is placed partly in the first opening 3a and under the surrounding semiconductor layer 4.

The second conductive barrier layer 20 is formed under the first capacitor electrode 7 in the capacitor portion. Placing the second conductive barrier layer 20 in this way increases the conductivity of the capacitor. The second conductive barrier layer 20 can be formed in the same step as the first conductive barrier layer 2 above the protective insulating film 3.

For example, after creating the first opening 3a in the protective insulating film 3, the first conductive barrier layer 2 is further formed on the protective insulating film 3. After that, the rest of the first conductive barrier layer 2 outside of the positions corresponding to the semiconductor layer 4 and the first capacitor electrode 7 is removed. The above-described structure is thereby produced.

Fourth Embodiment

Figure 4:
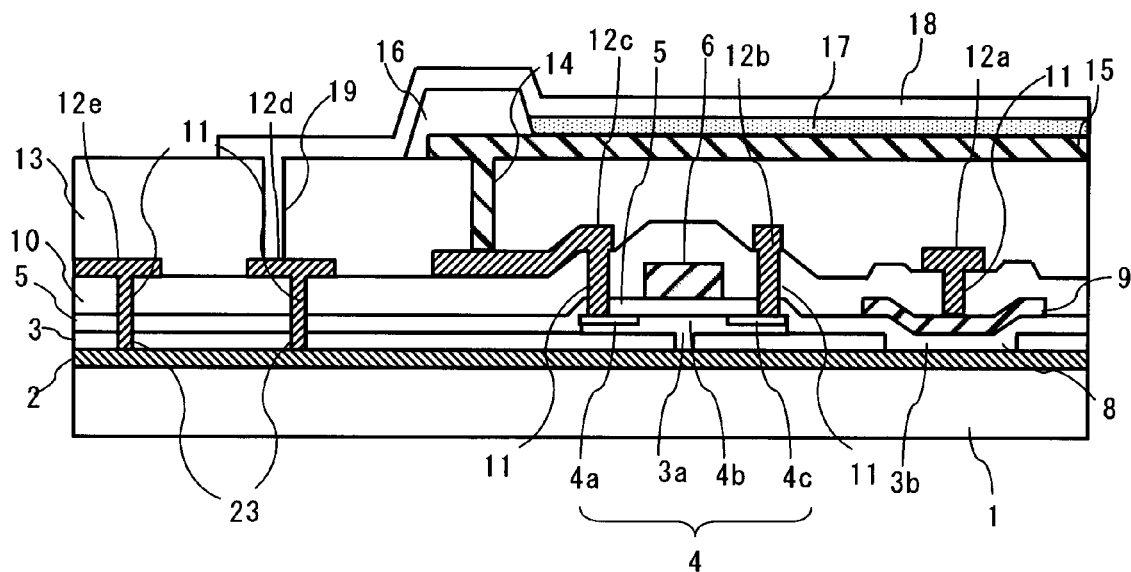
FIG. 4 is a cross-sectional view showing the structure of an active matrix organic EL display apparatus according to a fourth embodiment of the invention.

An active matrix display apparatus according to a fourth embodiment of the present invention is described hereinafter with reference to FIG. 4. FIG. 4 is a cross-sectional view showing the structure of an organic EL display apparatus according to this embodiment. This embodiment is different from the first embodiment in the structure of a capacitor. In FIG. 4, the same elements as in FIG. 1 are denoted by the same reference numerals and the redundant description is not provided herein.

The organic EL display apparatus according to this embodiment includes a metal substrate 1, a first conductive barrier layer 2, a protective insulating film 3, a semiconductor layer 4, a gate insulating film 5, a gate electrode 6, a first capacitor electrode 7, a capacitor insulating film 8, a second capacitor electrode 9, a first interlayer insulating film 10, a contact hole 11, a wiring 12, a second interlayer insulating film 13, a contact hole 14, a pixel electrode 15, an opening insulating film 16, a luminous layer 17, a counter electrode 18, and a contact hole 19. As described in the first embodiment, the wiring 12 involves a line 12a, a line 12b, a line 12c, a line 12d, and a line 12e.

As shown in FIG. 4, in the capacitor portion, a second opening 3b is created in the protective insulating film 3. The second opening 3b is filled with the capacitor insulating film 8. The second capacitor electrode 9 is formed on the capacitor insulating film 8. Thus, the capacitor is formed in the position corresponding to the second opening 3b. In this embodiment, the capacitor is composed of the first conductive barrier layer 2, the capacitor insulating film 8 and the second capacitor electrode 9. Thus, the first conductive barrier layer 2 serves also as a lower electrode of the capacitor. The capacitor insulating film 8 may have a different property and thickness from the gate insulating film 5 to thereby control the capacitance. The structure of the TFT portion in this embodiment is the same as the structure described in the first embodiment. The above structure may be produced by creating the first opening 3a and the second opening 3b in the protective insulating film 3 and then forming the semiconductor layer 4 thereabove, for example.

Fifth Embodiment

Figure 5:
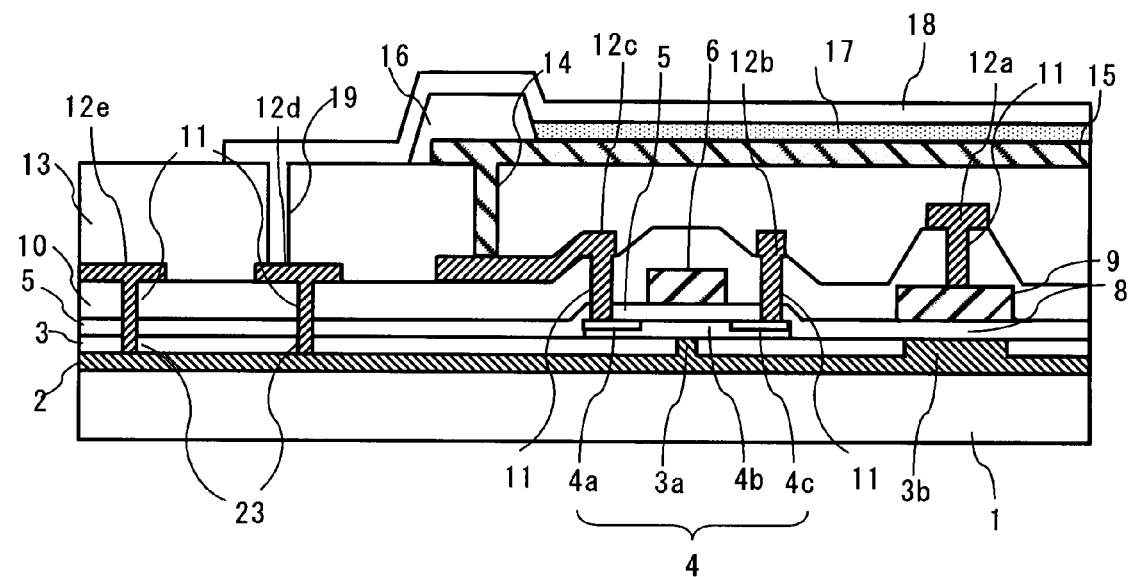
FIG. 5 is a cross-sectional view showing the structure of an active matrix organic EL display apparatus according to a fifth embodiment of the invention.

An active matrix display apparatus according to a fifth embodiment of the present invention is described hereinafter with reference to FIG. 5. FIG. 5 is a cross-sectional view showing the structure of an organic EL display apparatus according to this embodiment. This embodiment is different from the second embodiment in the structure of a capacitor. In FIG. 5, the same elements as in FIG. 1 are denoted by the same reference numerals and the redundant description is not provided herein.

The organic EL display apparatus according to this embodiment includes a metal substrate 1, a first conductive barrier layer 2, a protective insulating film 3, a semiconductor layer 4, a gate insulating film 5, a gate electrode 6, a first capacitor electrode 7, a capacitor insulating film 8, a second capacitor electrode 9, a first interlayer insulating film 10, a contact hole 11, a wiring 12, a second interlayer insulating film 13, a contact hole 14, a pixel electrode 15, an opening insulating film 16, a luminous layer 17, a counter electrode 18, and a contact hole 19. As described in the first embodiment, the wiring 12 involves a line 12a, a line 12b, a line 12c, a line 12d, and a line 12e.

As shown in FIG. 5, in the capacitor portion, a second opening 3b is created in the protective insulating film 3. A part or whole of the second opening 3b is filled with the first conductive barrier layer 2. Thus, the first conductive barrier layer 2 is formed so as to lie under the protective insulating film 3 and to fill the second opening 3b. Above the second opening 3b, the capacitor insulating film 8 is formed on the first conductive barrier layer 2. The second capacitor electrode 9 is formed on the capacitor insulating film 8. Thus, the capacitor is formed in the position corresponding to the second opening 3b. In this embodiment, the capacitor is composed of the first conductive barrier layer 2 that lies under the protective insulating film 3 and inside the second opening 3b, the capacitor insulating film 8 and the second capacitor electrode 9. Thus, in this embodiment also, the first conductive barrier layer 2 serves also as a lower electrode of the capacitor as in the fourth embodiment.

The structure of the TFT portion in this embodiment is the same as the structure described in the second embodiment. Specifically, the first conductive barrier layer 2 exists also inside the first opening 3a. For example, after creating the first opening 3a and the second opening 3b, the first conductive barrier layer 2 having the thickness corresponding to the thickness of the protective insulating film 3 is further formed on the protective insulating film 3. After that, the rest of the first conductive barrier layer 2 outside of the first opening 3a and the second opening 3b is removed. The above-described structure is thereby produced.

Although the second opening 3b is filled with the first conductive barrier layer 2 in this embodiment, it is not limited thereto. For example, the second opening 3b may be filled with a conductive barrier material that is different from the first conductive barrier layer 2. In such a case, it is important that a selected material has good electrical connectivity with the first conductive barrier layer 2 and it is easy to perform smoothing process such as CMP after filling the second opening 3b of the protective insulating film 3 with a selected conductive barrier material. Further, the first opening 3a of the protective insulating film 3 may be filled with the same conductive barrier material as that in the second opening 3b. It is important that the material is hardly diffused to the semiconductor layer 4. In view of these conditions, it is preferred to use a single-layer film of TiN, TaN, ZrN or VN or a composite film having these as an upper layer.

Sixth Embodiment

Figure 6:
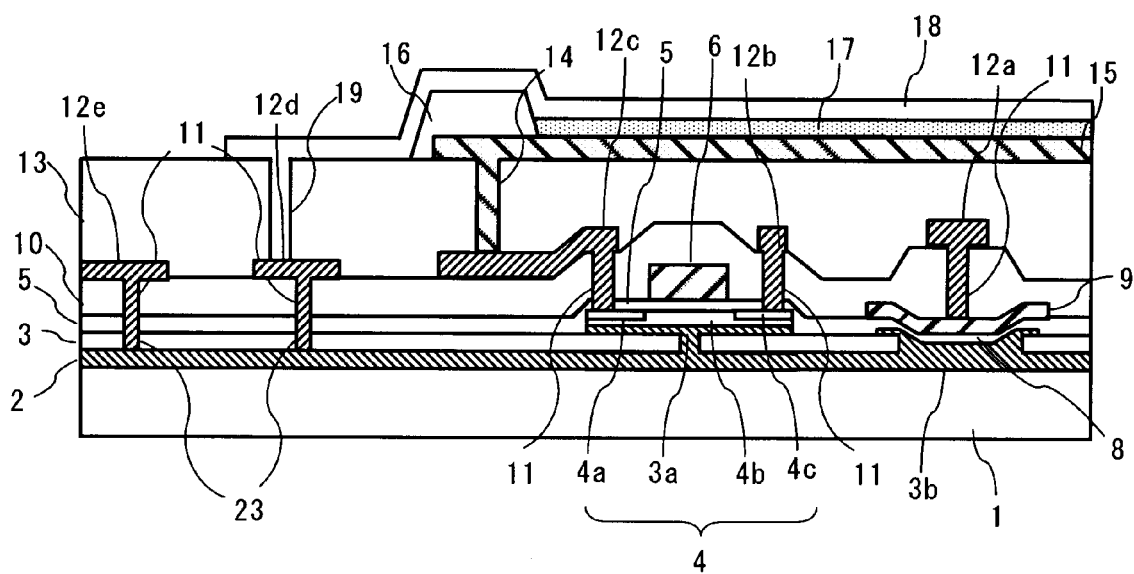
FIG. 6 is a cross-sectional view showing the structure of an active matrix organic EL display apparatus according to a sixth embodiment of the invention.
Figure 7:
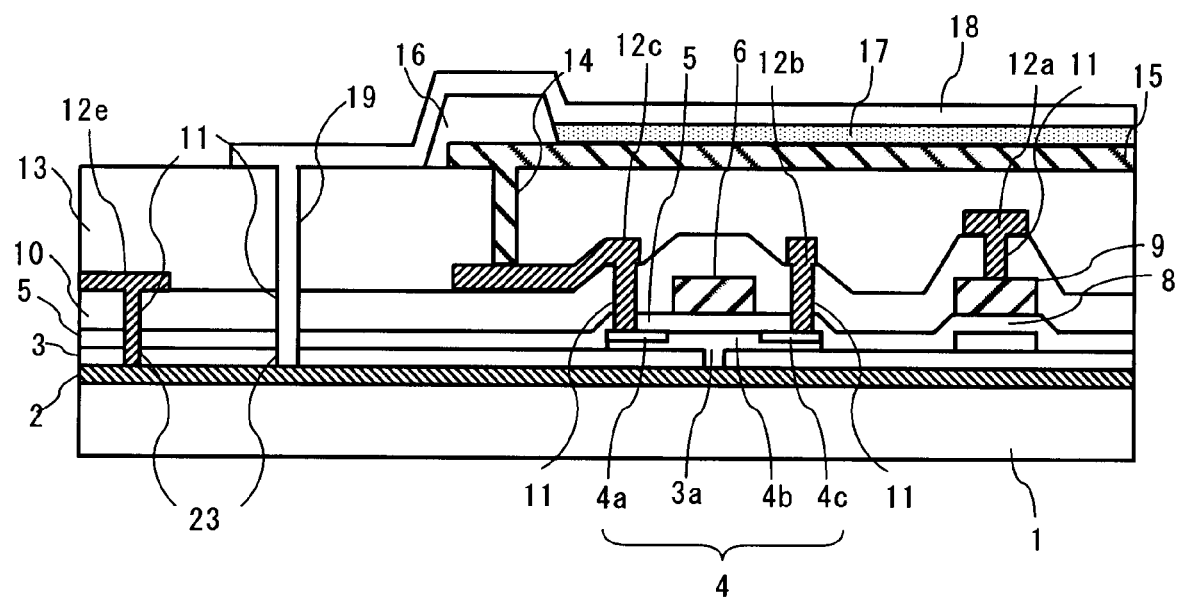
FIG. 7 is a cross-sectional view showing the structure of an active matrix organic EL display apparatus according to another embodiment of the invention.
Figure 8:
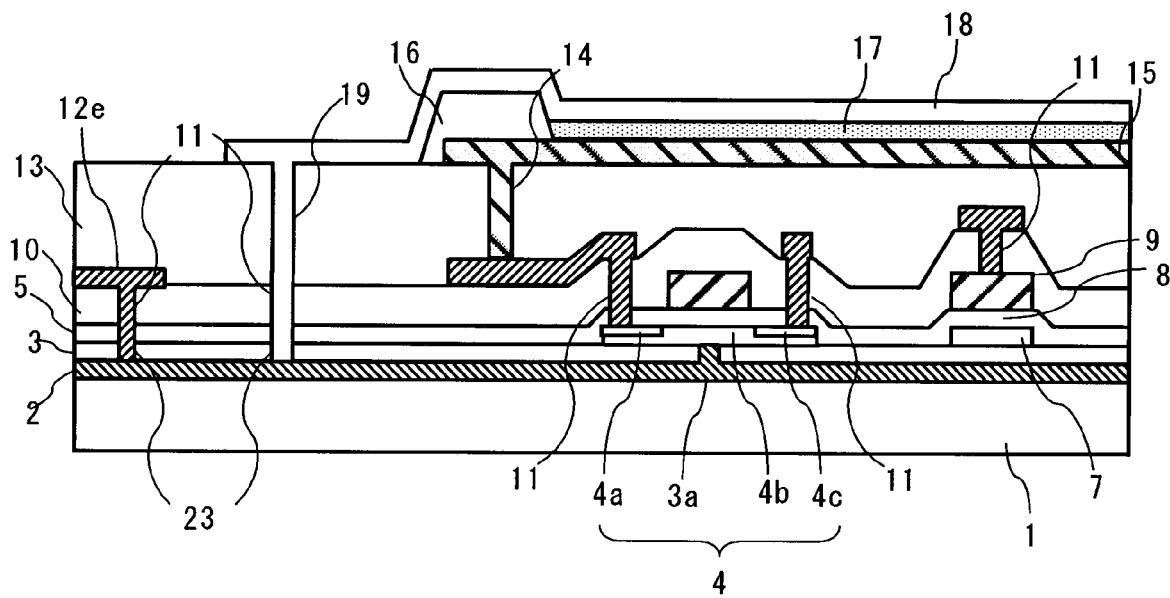
FIG. 8 is a cross-sectional view showing another structure of an active matrix organic EL display apparatus according to another embodiment of the invention.
Figure 9:
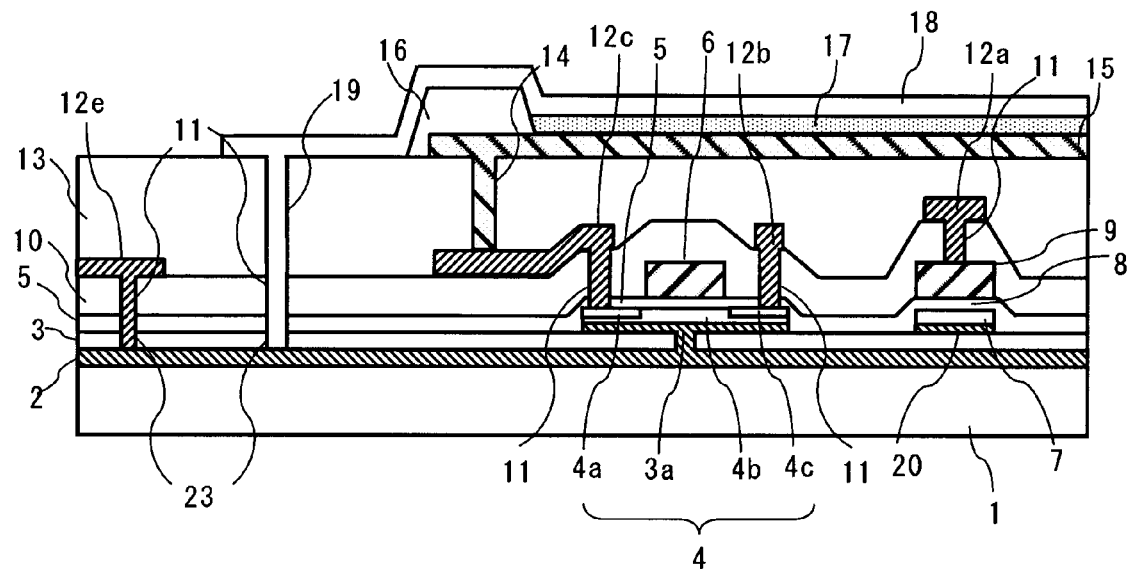
FIG. 9 is a cross-sectional view showing another structure of an active matrix organic EL display apparatus according to another embodiment of the invention.
Figure 10:
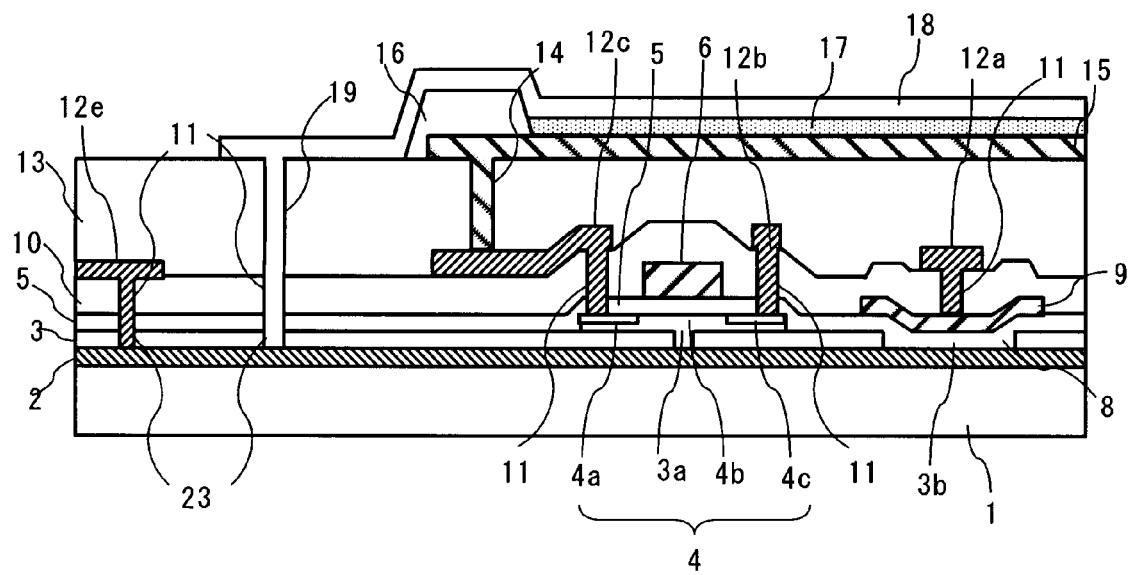
FIG. 10 is a cross-sectional view showing another structure of an active matrix organic EL display apparatus according to another embodiment of the invention.
Figure 11:
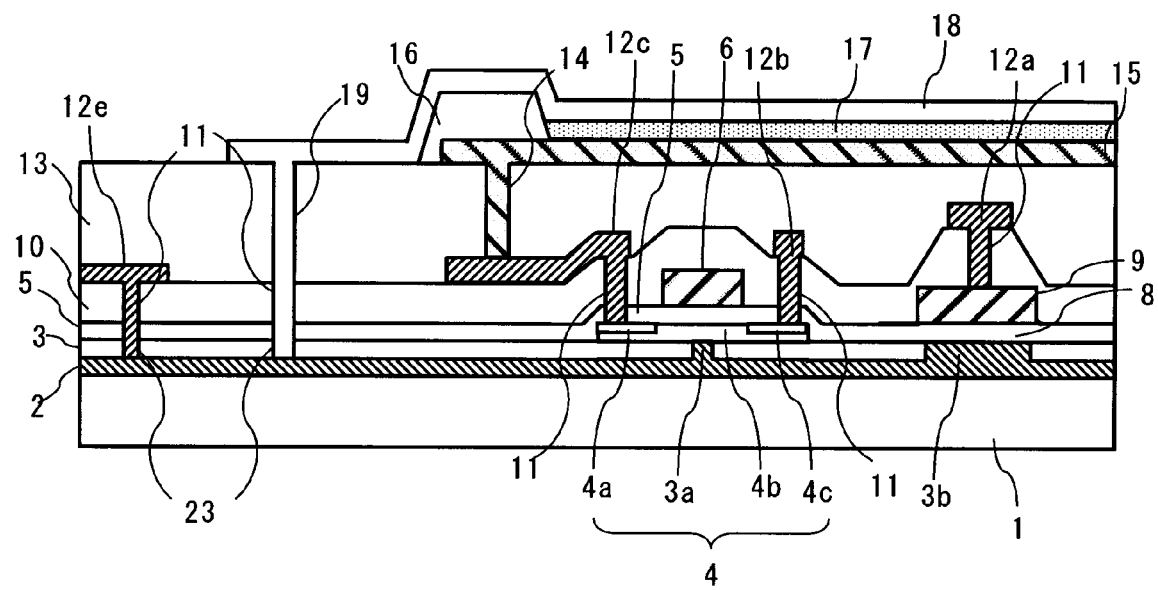
FIG. 11 is a cross-sectional view showing another structure of an active matrix organic EL display apparatus according to another embodiment of the invention.
Figure 12:
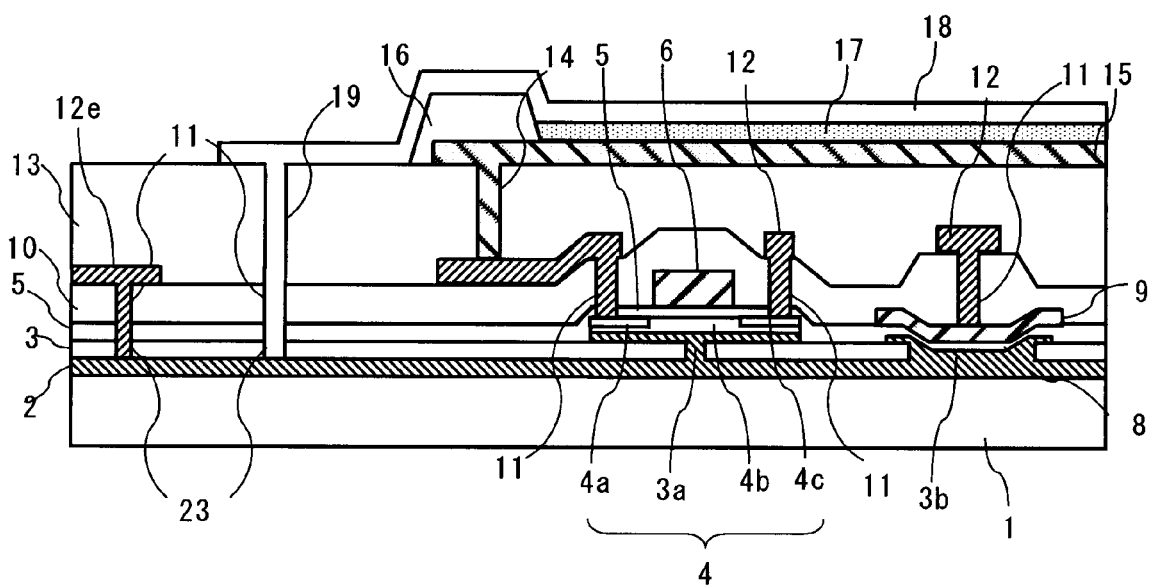
FIG. 12 is a cross-sectional view showing another structure of an active matrix organic EL display apparatus according to another embodiment of the invention.

An active matrix display apparatus according to a sixth embodiment of the present invention is described hereinafter with reference to FIG. 6. FIG. 6 is a cross-sectional view showing the structure of an organic EL display apparatus according to this embodiment. This embodiment is different from the third embodiment in the structure of a capacitor. In FIG. 6, the same elements as in FIG. 1 are denoted by the same reference numerals and the redundant description is not provided herein.

The organic EL display apparatus according to this embodiment includes a metal substrate 1, a first conductive barrier layer 2, a protective insulating film 3, a semiconductor layer 4, a gate insulating film 5, a gate electrode 6, a first capacitor electrode 7, a capacitor insulating film 8, a second capacitor electrode 9, a first interlayer insulating film 10, a contact hole 11, a wiring 12, a second interlayer insulating film 13, a contact hole 14, a pixel electrode 15, an opening insulating film 16, a luminous layer 17, a counter electrode 18, a contact hole 19, and a second conductive barrier layer 20. As described in the first embodiment, the wiring 12 involves a line 12a, a line 12b, a line 12c, a line 12d, and a line 12e.

As shown in FIG. 6, in the capacitor portion, the second opening 3b is created in the protective insulating film 3. The second opening 3b is partly or entirely filled with the first conductive barrier layer 2. Thus, the first conductive barrier layer 2 is formed so as to lie under the protective insulating film 3 and to fill the second opening 3b. Further, the first conductive barrier layer 2 extends over the protective insulating film 3. The first conductive barrier layer 2 is placed partly in the second opening 3b and in its vicinity because covering all over the top surface of the protective insulating film 3 causes a short-circuit between TFTs.

Above the second opening 3b, the capacitor insulating film 8 is formed on the first conductive barrier layer 2. The second capacitor electrode 9 is formed on the capacitor insulating film 8. Thus, the capacitor is formed in the position corresponding to the second opening 3b. In this embodiment, the capacitor is composed of the first conductive barrier layer 2 that lies under the protective insulating film 3 to the vicinity of above the second opening 3b, the capacitor insulating film 8 and the second capacitor electrode 9. Thus, in this embodiment also, the first conductive barrier layer 2 serves also as a lower electrode of the capacitor as in the fourth and fifth embodiments.

The structure of the TFT portion in this embodiment is the same as the structure described in the third embodiment. Specifically, the first conductive barrier layer 2 exists inside the first opening 3a and the vicinity of above the first opening 3a. For example, after creating the first opening 3a and the second opening 3b in the protective insulating film 3, the first conductive barrier layer 2 is further formed on the protective insulating film 3. After that, the rest of the first conductive barrier layer 2 outside of the semiconductor layer 4 and the second capacitor electrode 9 is removed. The above-described structure is thereby produced.

Although the first conductive barrier layer 2 extends to the vicinity of above the second opening 3b in this embodiment, it is not limited thereto. For example, the second opening 3b may be filled with a conductive barrier material that is different from the first conductive barrier layer 2. In such a case, it is important that the material has good electrical connectivity with the first conductive barrier layer 2. Further, the first opening 3a of the protective insulating film 3 may be filled with the same conductive barrier material as that in the second opening 3b. In such a case, it is important that the material is hardly diffused to the semiconductor layer 4. In view of these conditions, it is preferred to use a single-layer film of TiN, TaN, ZrN or VN or a composite film having these as an upper layer.

Other Embodiments

Active matrix display apparatus according to other embodiments of the present invention are described hereinafter with reference to FIGS. 7 to 12. The structures of the TFT and the capacitor shown in FIGS. 7 to 12 are the same as the structures shown in FIGS. 1 to 6 except that the counter electrode 18 is electrically connected with the first conductive barrier layer 2 directly without through the line 12d. Thus, the line 12d described in the first embodiment is not provided in the structures shown in FIGS. 7 to 12.

As shown in FIGS. 7 to 12, the contact hole 19 in the second interlayer insulating film 13, the contact hole 11 in the first interlayer insulating film 10, and a contact hole in an insulating layer therebelow are continuous from the counter electrode 18 to the first conductive barrier layer 2. Thus, the counter electrode 18 is directly connected with the first conductive barrier layer 2 through these contact holes.

A transparent conductive layer is used as the counter electrode 18. Therefore, the conductive barrier layer 2 should have good electrical connectivity with the transparent conductive layer. For this reason, the surface of the conductive barrier layer 2 to be connected with the counter electrode 18 is preferably made of a material such as TiN, TaN, ZrN, VN or Mo. It is thereby possible to further simplify the wiring 12 and fix the voltage of the counter electrode 18 to the voltage of the metal substrate 1 through the first conductive barrier layer 2.

As described above, the first conductive barrier layer 2 suppresses the diffusion of impurity from the metal substrate 1 to the semiconductor layer 4. This enables the provision of an active matrix display apparatus having TFTs with stable characteristics. Further, the placement of the first conductive barrier layer 2 between the substrate 1 and the protective insulating film 3 stabilizes the voltage of the semiconductor layer of the TFT. Furthermore, the deposition of the first conductive barrier layer 2 substantially all over the metal substrate 1 allows a common voltage of the circuits including TFTs to be fixed to the voltage of the metal substrate 1. This enables the provision of an active matrix display apparatus having advanced display characteristics.

Although a self-luminous organic EL display apparatus is described in the above embodiments as an example of the active matrix display apparatus, the present invention is not limited thereto. The present invention may be applied to reflective liquid crystal display apparatus. In the reflective liquid crystal display apparatus, the luminous layer 17 is not provided, and the pixel electrode 15 drives the liquid crystal that is filled between the pixel electrode 15 and a counter electrode formed on another transparent substrate. The present invention may be applied also to active matrix display apparatus of current drive system such as inorganic EL display apparatus. In these applications, it is possible to form a TFT having stable characteristics on a metal substrate and to fix the voltage of a silicon layer forming the TFT to the voltage of the metal substrate with a simple structure.

Figure 13:
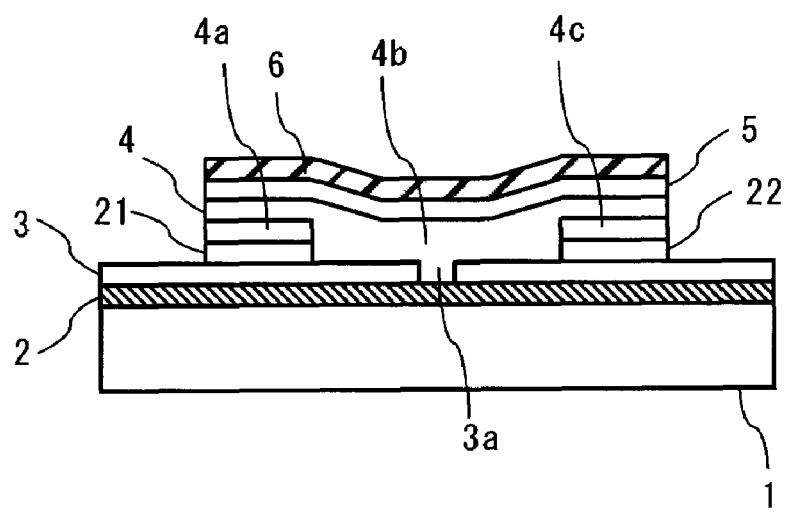
FIG. 13 is a cross-sectional view showing the structure of a staggered thin film transistor according to another embodiment of the invention.
Figure 14:
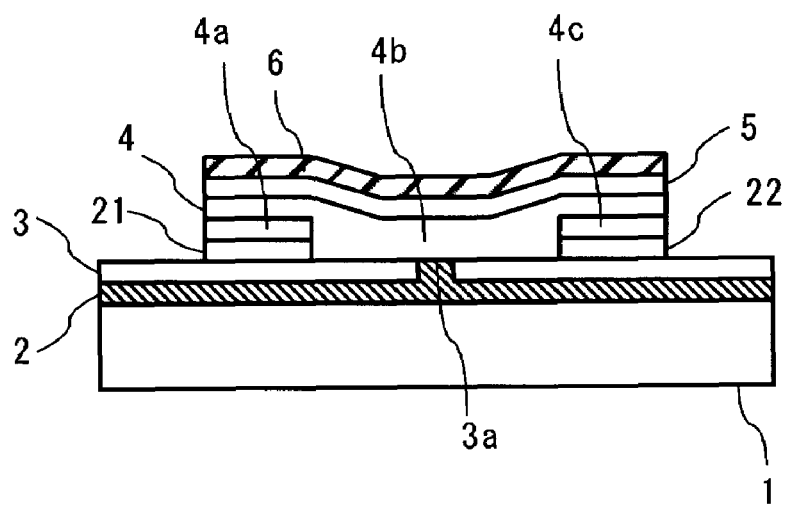
FIG. 14 is a cross-sectional view showing the structure of a staggered thin film transistor according to another embodiment of the invention.

Although the above embodiments are described with reference to the case of using a coplanar TFT, the same effect is obtained when using a staggered TFT. Specifically, a source electrode and a drain electrode may be placed below the semiconductor layer 4. For example, FIG. 13 shows the structure with a staggered TFT in which a silicon material fills the opening 3a as described in the first embodiment. A drain electrode 21 is placed between the drain region 4a and the protective insulating film 3, and a source electrode 22 is placed between the source region 4c and the protective insulating film 3. The first opening 3a is created so that the first conductive barrier layer 2 filling the first opening 3a does not contact with the source electrode 22 nor the drain electrode 21. On the other hand, FIG. 14 shows the structure with a staggered TFT in which the first conductive barrier layer 2 material fills the opening 3a as described in the second embodiment. The use of the staggered TFT produces the same advantages.

Figure 15A:
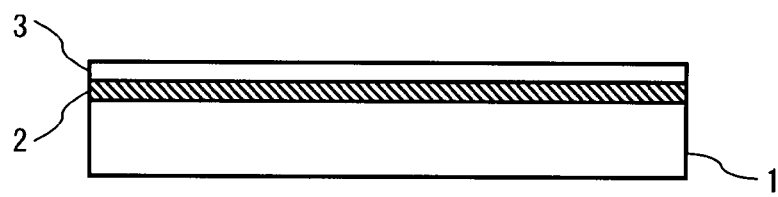
FIGS. 15A to 15D are cross-sectional views showing the process of manufacturing a thin film transistor according to the first embodiment of the invention.
Figure 15B:
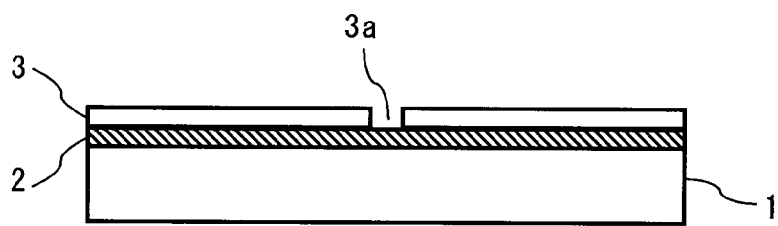
Figure 15C:
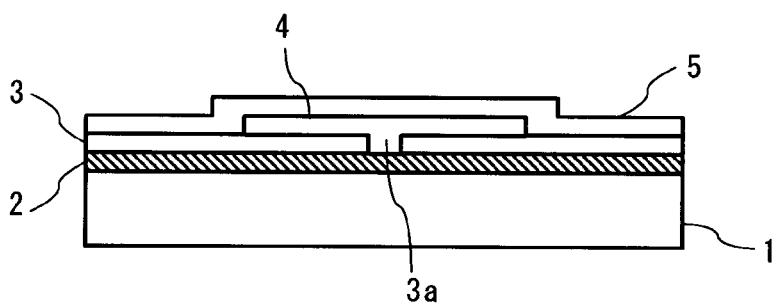

A method of manufacturing the thin film transistor described in the foregoing is described hereinafter with reference to FIGS. 15A to 15C. FIGS. 15A to 15C are cross-sectional views showing the process of manufacturing the thin film transistor according to embodiments of the present invention. FIGS. 15A to 15C illustrate the cross section of the transistor portion only. A manufacturing method of the TFT according to the first embodiment is mainly described hereinafter as one example of TFT manufacturing methods.

Firstly, the metal substrate 1 is prepared. The metal substrate 1 may be made of the above-described materials. The smoothness and the flatness of the substrate surface are important in forming a TFT on the metal substrate 1. The surface flatness is important when laminating layers of given shapes on the substrate. In order to create a pattern on the metal substrate 1, a transfer method such as photolithography is typically used. It is thus necessary to satisfy the flatness required for a transfer method that is used in the etching process after depositing a given thin film on the metal substrate 1. For example, a projection transfer method requires the flatness within the depth of focus. Thus, the flatness of the metal substrate 1 is generally preferably 50 µm or less.

The surface smoothness is important to stabilize the electrical characteristics between the layers formed above the metal substrate 1. If the surface roughness is large, the thickness of the gate insulating film 5 partly decreases to deteriorate the pressure resistance of the gate insulating film 5. Therefore, the surface roughness is preferably 20 nm or less at an RMS value. It is preferred to use the CMP process or the electrical field abrasive polishing to obtain a flat plane with suitable surface roughness.

Then, the first conductive barrier layer 2 is formed on the metal substrate 1. For the first conductive barrier layer 2, a material to avoid the diffusion is used so as to prevent the metal substrate substance from being diffused to deteriorate the semiconductor layer 4 placed thereabove. The above-described materials may be used as the first conductive barrier layer 2. The first conductive barrier layer 2 may be formed by sputtering or reactive sputtering, for example. For the deposition of a nitride film, for example, the reactive sputtering that supplies nitrogen gas may be used. The first conductive barrier layer 2 may be formed substantially all over the metal substrate 1.

After that, the protective insulating film 3 is formed on the first conductive barrier layer 2. The structure shown in FIG. 15A is thereby produced. The protective insulating film 3 is formed substantially all over the metal substrate 1 so as to cover the first conductive barrier layer 2. The protective insulating film 3 should be made of a material that suppresses the diffusion of a base metal to the upper part and that does not cause a trap level of an electron or positive hole at the interface with the semiconductor layer 4 and, particularly, the channel region 4b. The above-described materials may be used for the protective insulating film 3. Specifically, a silicon nitride film with the thickness of 50 nm or larger is formed on the first conductive barrier layer 2. This prevents the contamination from the metal substrate 1. Further, a silicon oxide film with the thickness of 300 nm or larger is formed on the silicon nitride film to create a laminated structure. This reduces the capacitance due to the metal substrate 1 and the first conductive barrier layer 2, thereby suppressing capacitance coupling.

The protective insulating film 3 may be formed by CVD. If the surface roughness of the metal substrate 1 is large, it is possible to form a silicon oxide film having the thickness larger than a prescribed thickness by CVD and then smooth the film by CMP. It is also possible to spin-coat a silicon oxide film material below the silicon nitride film or the silicon oxide film to thereby improve the surface roughness.

Then, the first opening 3a is created in a part of the protective insulating film 3. The first opening 3a may be made by photolithography, for example. The structure shown in FIG. 15B is thereby produced. In the fifth embodiment or the like, the second opening 3b is created in this step. Further, a silicon material to form the semiconductor layer 4 is deposited on the protective insulating film 3. The semiconductor layer 4 may be made of an amorphous silicon film, a micro-crystal silicon film, or a polysilicon film. The semiconductor layer 4 may be formed by CVD. The semiconductor layer 4 thereby fills the first opening 3a.

When using a polysilicon film, it is possible to form the polysilicon film directly by CVD. Alternatively, it is possible to form an amorphous silicon film by CVD and then grow polycrystals by heat treatment. It is further possible to form an amorphous silicon film by CVD and then promotes polycrystallization by annealing with laser. In terms of the reduction of process temperature, the laser annealing is most preferable, and the heat treatment growth is the second most preferable. If the surface roughness is degraded due to the laser annealing, it is preferred to perform the CMP process on the surface. It is thereby possible to suppress the degradation of the surface roughness and improve the TFT characteristics.

Then, the silicon film is patterned by photolithography. The pattern of the semiconductor layer 4 is thereby created. The semiconductor layer 4 is formed above the first opening 3a. Thus, the semiconductor layer 4 is connected with the first conductive barrier layer 2. The semiconductor layer 4 is patterned into the size larger than the first opening 3a so as to cover the first opening 3a. It is possible to form the first capacitor electrode 7 in this step. In such a case, the first capacitor electrode 7 and the semiconductor layer 4 are formed of the same material. Further, the gate insulating film 5 is formed to cover the semiconductor layer 4. The gate insulating film 5 may be made of the above-described materials. The structure shown in FIG. 15C is thereby produced. In the same step as forming the gate insulating film 5, the capacitor insulating film 8 may be formed. In such a case, the gate insulating film 5 and the capacitor insulating film 8 are formed of the same material.

Figure 15D:
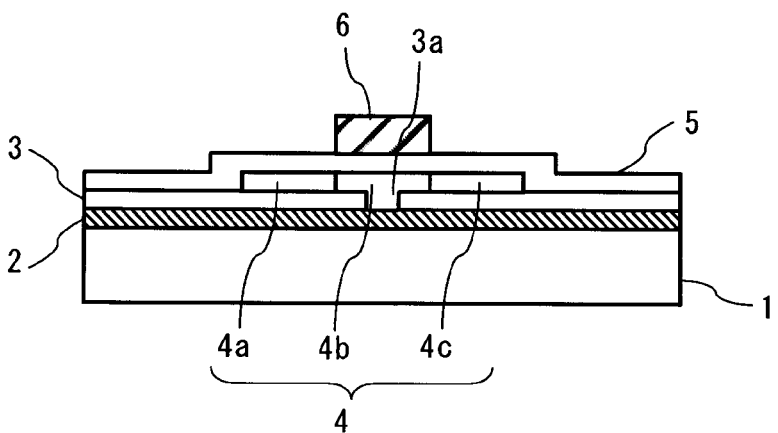

Then, the gate electrode 6 is formed on the gate insulating film 5. The gate electrode 6 may be made of a metal film or a doped polysilicon film. The metal layer or the polysilicon film 6 is patterned by photolithography. The second capacitor electrode 9 may be formed in this step. In such a case, the second capacitor electrode 9 and the gate electrode 6 are formed of the same material. Aligning the source region 4c, the channel region 4b and the drain region 4a included in the semiconductor layer 4 with the gate electrode 6 allows reduction of the parasitic capacitance of the TFT. It is thefore preferred to form the gate electrode 6 and then inject or dope impurity into the source region 4c and the drain region 4a using the gate electrode 6 as a mask. The TFT having structure shown in FIG. 15D is thereby produced. Subsequently, the first interlayer insulating film 10, the contact hole 11, the wiring 12 composed of the line 12a, the line 12b, the line 12c, the line 12d and the line 12e, the second interlayer insulating film 13, the contact hole 14, the pixel electrode 15, the opening insulating film 16, the luminous layer 17 and the counter electrode 18 are formed sequentially.

In order to expose the first conductive barrier layer 2 through the contact hole 11, it is necessary to penetrate through the first interlayer insulating film 10, the gate insulating film 5 and the protective insulating film 3. In this process, it is preferred to perform selective etching so as to prevent the penetration through the drain region 4a and the source region 4c. For example, dry etching using Flon gas is suitable. The line 12a, the line 12b, the line 12c, the line 12d and the line 12e are formed at the same time by depositing and patterning a metal film after creating the contact hole 11 and the contact hole 23.

For the thin film transistor according to the second embodiment, a part of the first conductive barrier layer 2 may be etched while protecting the portion corresponding to the first opening 3a by resist. The protrusion corresponding to the first opening 3a is thereby formed in the first conductive barrier layer 2. After depositing the protective insulating film 3 on the first conductive barrier layer 2, the first opening 3a is created. The first opening 3a is thereby filled with the first conductive barrier layer 2.

Alternatively, a conductive barrier material may be formed after creating the first opening 3a. Then, the rest of the first conductive barrier layer 2 outside of the portion corresponding to the first opening 3a is removed by photolithography. Instead of the photolithography, the CMP process may be performed after depositing a conductive barrier material. The CMP process polishes to remove the conductive barrier material deposited on the protective insulating film 3. The first conductive barrier layer 2 thereby fills the first opening 3a. In this case, the conductive barrier films inside the first opening 3a and below the protective insulating film 3 may be made of different materials. For the TFT according to the third embodiment, the first conductive barrier layer 2 is formed after creating the first opening 3a. Then, the first conductive barrier layer 2 is patterned by photolithography. The first conductive barrier layer 2 and the semiconductor layer 4 can be thereby in contact with each other in a desired area. In this case also, the conductive barrier layers above and below the protective insulating film 3 may be made of different materials or the same material. At least one of the material of the first conductive barrier layer 2 and the material of the the semiconductor layer 4 may fill the first opening 3a for establishing a connection between the first conductive barrier layer 2 and the semiconductor layer 4.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A thin film transistor comprising:
   a metal substrate;
   a first conductive barrier layer disposed on the metal substrate to prevent diffusion of a substance of the metal substrate;
   a protective insulating film disposed on the first conductive barrier layer and having an opening;
   a semiconductor layer disposed on the protective insulating film, including a source region, a drain region and a channel region, and the channel region is directly connected with the first conductive barrier layer through the opening;
   a gate insulating film disposed on the semiconductor layer; and
   a gate electrode disposed above the semiconductor layer with the gate insulating film interposed between the gate electrode and the semiconductor layer.

2. The thin film transistor according to claim 1, wherein the first conductive barrier layer at least partly fills the opening of the protective insulating film.

3. The thin film transistor according to claim 2, wherein the first conductive barrier layer fills the opening and extends over the protective insulating film.

4. The thin film transistor according to claim 3, wherein the first conductive barrier layer comprises a high melting point metal or a conductive high melting point metal nitride.

5. The thin film transistor according to claim 3, wherein the first conductive barrier layer is a film containing at least one of Ti, Ta, W, Mo, TiN, TaN, W, MoN, ZrN, VN, HfN, NbN, TiZrN, and ZrVN.

6. The thin film transistor according to claim 3, wherein the protective insulating film is a single-layer film or a composite film including at least one of a silicon oxide film, a silicon nitride film and a silicon nitride/oxide film.

7. An active matrix display apparatus comprising:
   a thin film transistor according to claim 3; and
   a capacitor disposed on the metal substrate and including a first capacitor electrode and a second capacitor electrode.

8. The thin film transistor according to claim 1, wherein the first conductive barrier layer comprises a high melting point metal or a conductive high melting point metal nitride.

9. The thin film transistor according to claim 1, wherein the first conductive barrier layer is a film containing at least one of Ti, Ta, W, Mo, TiN, TaN, W, MoN, ZrN, VN, HfN, NbN, TiZrN, and ZrVN.

10. The thin film transistor according to claim 1, wherein the protective insulating film is a single-layer film or a composite film including at least one of a silicon oxide film, a silicon nitride film and a silicon nitride/oxide film.

11. An active matrix display apparatus comprising:
    a thin film transistor according to claim 1; and
    a capacitor disposed on the metal substrate and including a first capacitor electrode and a second capacitor electrode.

12. The active matrix display apparatus according to claim 11, wherein
    the first capacitor electrode is formed of a same material as the semiconductor layer.

13. The active matrix display apparatus according to claim 11, wherein
    a second conductive barrier layer is disposed between the first capacitor electrode and the protective insulating film.

14. The active matrix display apparatus according to claim 11, wherein
    the protective insulating film has a second opening, and
    the capacitor is placed in a position corresponding to the second opening, and the first capacitor electrode is formed of the first conductive barrier layer.

15. The active matrix display apparatus according to claim 14, wherein
    the first conductive barrier layer at least partly fills each of the first opening and the second opening.

16. The active matrix display apparatus according to claim 11, wherein
    a capacitor insulating film placed between the first capacitor electrode and the second capacitor electrode is formed of a same substance as the gate insulating film.

17. The active matrix display apparatus according to claim 11, wherein
    the gate electrode and the second capacitor electrode are formed of a same material.

18. The active matrix display apparatus according to claim 11, further comprising:
- a first interlayer insulating film to cover the thin film transistor and the capacitor;
- a line electrically connected with the first conductive barrier layer through a contact hole of the first interlayer insulating film;
- a second interlayer insulating film to cover the first interlayer insulating film and the line; and
- a pixel electrode electrically connected with the drain region through a contact hole of the second interlayer insulating film.

19. The active matrix display apparatus according to claim 18, wherein
- a surface roughness of the second interlayer insulating film is 50 nm or less at an RMS (Root Mean Square) value in an area of 100 $\mu m^2$.

20. The active matrix display apparatus according to claim 18, wherein
- a surface roughness of the pixel electrode is 50 nm or less at an RMS (Root Mean Square) value in an area of 100 $\mu m^2$.

21. The active matrix display apparatus according to claim 18, further comprising:
- a counter electrode disposed opposite to the pixel electrode with a luminous layer interposed therebetween and electrically connected with the line or the first conductive barrier layer through an opening of the second interlayer insulating film.

22. A manufacturing method of a thin film transistor comprising:
- forming a first conductive barrier layer on a metal substrate to prevent diffusion of substance of the metal substrate;
- forming a protective insulating film having an opening on the first conductive barrier layer;
- forming a semiconductor layer, including a source region, a drain region and a channel region, wherein the channel region is directly connected with the first conductive barrier layer through the opening of the protective insulating film;
- forming a gate insulating film on the semiconductor layer; and
- forming a gate electrode on the gate insulating film.

23. The manufacturing method of a thin film transistor according to claim 22, wherein
- the first conductive barrier layer at least partly fills the opening of the protective insulating film.

24. The manufacturing method of a thin film transistor according to claim 22, wherein
- a part of the semiconductor layer at least partly fills the opening of the protective insulating film.

* * * * *